(12) United States Patent
Anand

(10) Patent No.: US 7,616,068 B2
(45) Date of Patent: *Nov. 10, 2009

(54) FREQUENCY SYNTHESIZER FOR INTEGRATED CIRCUIT RADIOS

(75) Inventor: Seema B. Anand, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 99 days.

This patent is subject to a terminal disclaimer.

(21) Appl. No.: 11/686,938

(22) Filed: Mar. 15, 2007

(65) Prior Publication Data

US 2008/0166986 A1 Jul. 10, 2008

Related U.S. Application Data

(60) Provisional application No. 60/873,204, filed on Dec. 6, 2006.

(51) Int. Cl.
*H03L 7/093* (2006.01)

(52) U.S. Cl. .............. 331/17; 331/16; 331/34; 327/156

(58) Field of Classification Search .......... 331/16, 331/17, 14, 8, 34, 179; 327/156, 157
See application file for complete search history.

(56) References Cited

U.S. PATENT DOCUMENTS

| | | | |
|---|---|---|---|
| 6,806,780 B2 * | 10/2004 | Fontaine et al. | 331/17 |
| 7,405,630 B2 * | 7/2008 | Jensen | 331/17 |
| 2003/0155950 A1 * | 8/2003 | van der Valk et al. | 327/156 |
| 2005/0218998 A1 * | 10/2005 | Lim | 331/16 |
| 2008/0136536 A1 * | 6/2008 | Anand | 331/17 |

* cited by examiner

*Primary Examiner*—Robert Pascal
*Assistant Examiner*—Ryan J. Johnson
(74) *Attorney, Agent, or Firm*—Garlick Harrison & Markison; James A. Harrison

(57) ABSTRACT

An integrated circuit radio transceiver and method therefor includes capacitive loop filter with selectable capacitive elements that are operable to adjust a signal level provided to a voltage controlled oscillator to control a frequency of an output signal of the oscillator. A plurality of switches are controlled by logic to define a discharge mode, a charge mode and charge sharing mode in which a plurality of capacitive elements share charge while generating the input voltage to the oscillator.

25 Claims, 11 Drawing Sheets radio transceiver

MIMO transceiver parallel capacitive block 194 for integrated circuit transceiver

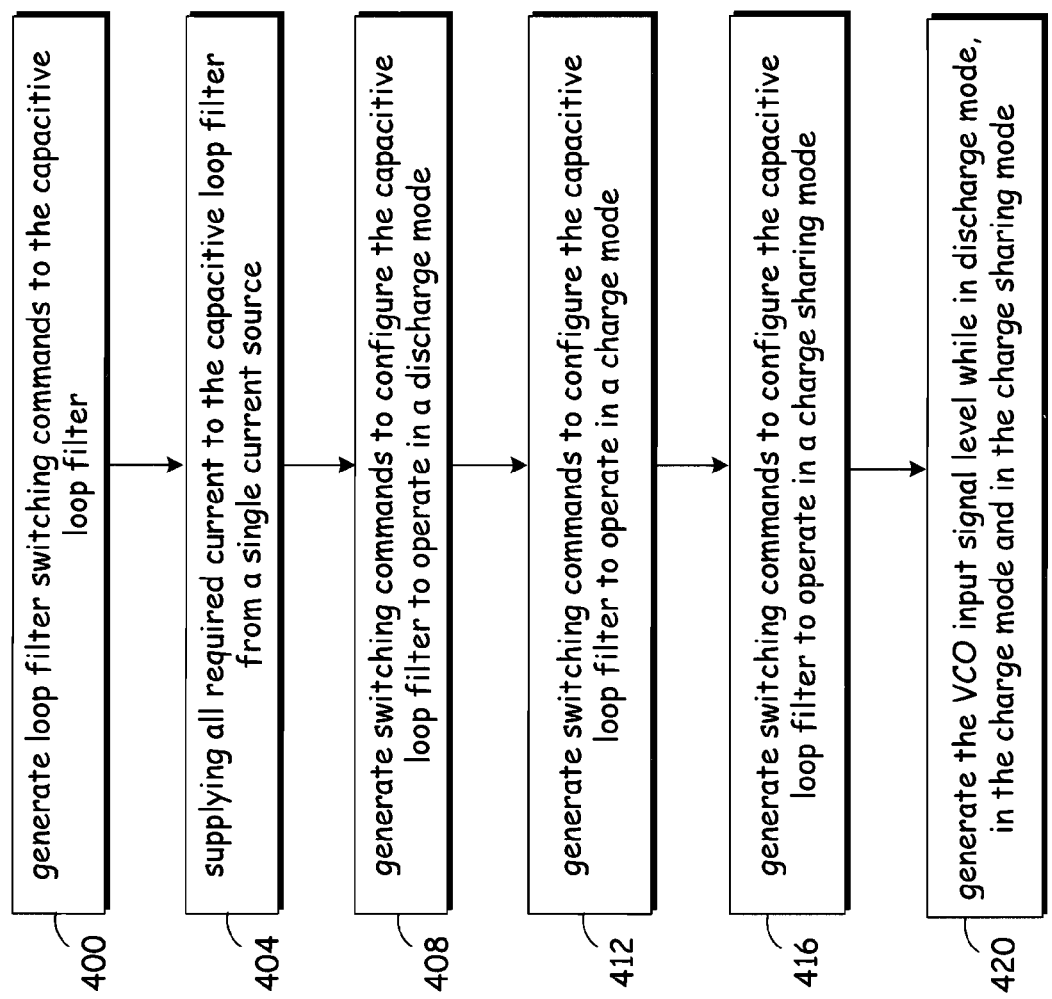

FREQUENCY SYNTHESIZER FOR INTEGRATED CIRCUIT RADIOS

CROSS REFERENCE TO RELATED APPLICATIONS

This application claims priority to U.S. Provisional Application Ser. No. 60/873,204 entitled, "Universal Frequency Synthesizer with Switch Capacitor Loop Filter", filed Dec. 6, 2006, which is hereby incorporated herein by reference in its entirety for all purposes.

BACKGROUND

1. Technical Field

The present invention relates to wireless communications and, more particularly, to integrated circuit radio frequency synthesizer circuitry for providing low noise and low power consumption frequency control.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

Within an integrated circuit radio transceiver, a precise signal frequency is required for conversion to and from radio frequencies. Traditional circuits, and more particularly, loop filters in phase locked loop (PLL) applications, are known to be noisy, require a certain amount of power, and consume valuable hardware resources.

FIG. 1 is a block diagram of a prior art phase locked loop that includes a traditional loop filter for generating an input signal to a voltage controlled oscillator. In general, a phase frequency detector (PFD) is operable to generate a pair of control signals to a corresponding pair of current sources that are configured to operate as a current source and as a current sink. Typically, such a configuration requires the sources to be matched in functional capability so that equivalent control commands to source or to sink current will have equivalent effects. Thus, as may be seen, the two current sources are operably disposed on different sides of a node that sources or sinks current to a loop filter. Thus, if no change to the voltage controlled oscillator (VCO) output frequency is required, meaning no change is required to the signal level produced to the VCO, then it is desirable for the current source coupled downstream of the input node to the loop filter to sink the exact amount of current produced by the current source upstream of the input node to the loop filter. By matching the current generated by both current sources, the signal level generated by the loop filter to the VCO remains constant and the VCO produces a constant frequency output.

As may further be seen, the traditional loop filter of the PLL of FIG. 1 includes series coupling a capacitor and a resistor that which are jointly are in parallel to a capacitor. Further, both capacitors are coupled to circuit common. In general, when current is sourced into the loop filter, the charge on the capacitors increases thereby increasing a direct current (DC) voltage signal level produced to the VCO and, therefore, the output frequency of the VCO. When current is sinked from the input node to the loop filter, the charge and VCO input signal level are decreased thereby decreasing the VCO output frequency. Thus, the PFD is operable to control the output frequency of the VCO by generating control commands to switches between the input node to the traditional loop filter and each of the two current sources to control relative sourcing and sinking of current to or from, respectively, the input node to the loop filter. Thus, the PFD controls the VCO output frequency by sourcing net current into, sinking net current from or maintaining an equal amount of current sourced and sinked from the input node to the loop filter. Typically, for noise purposes, the capacitors of the loop filter and the current sources are relatively large to reduce noise to reduce interference with RF signals being processed by frequencies generated by the loop filter.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 10 is a flow chart illustrating a method according to one embodiment of the present invention;

DETAILED DESCRIPTION OF THE DRAWINGS

Figure 1:
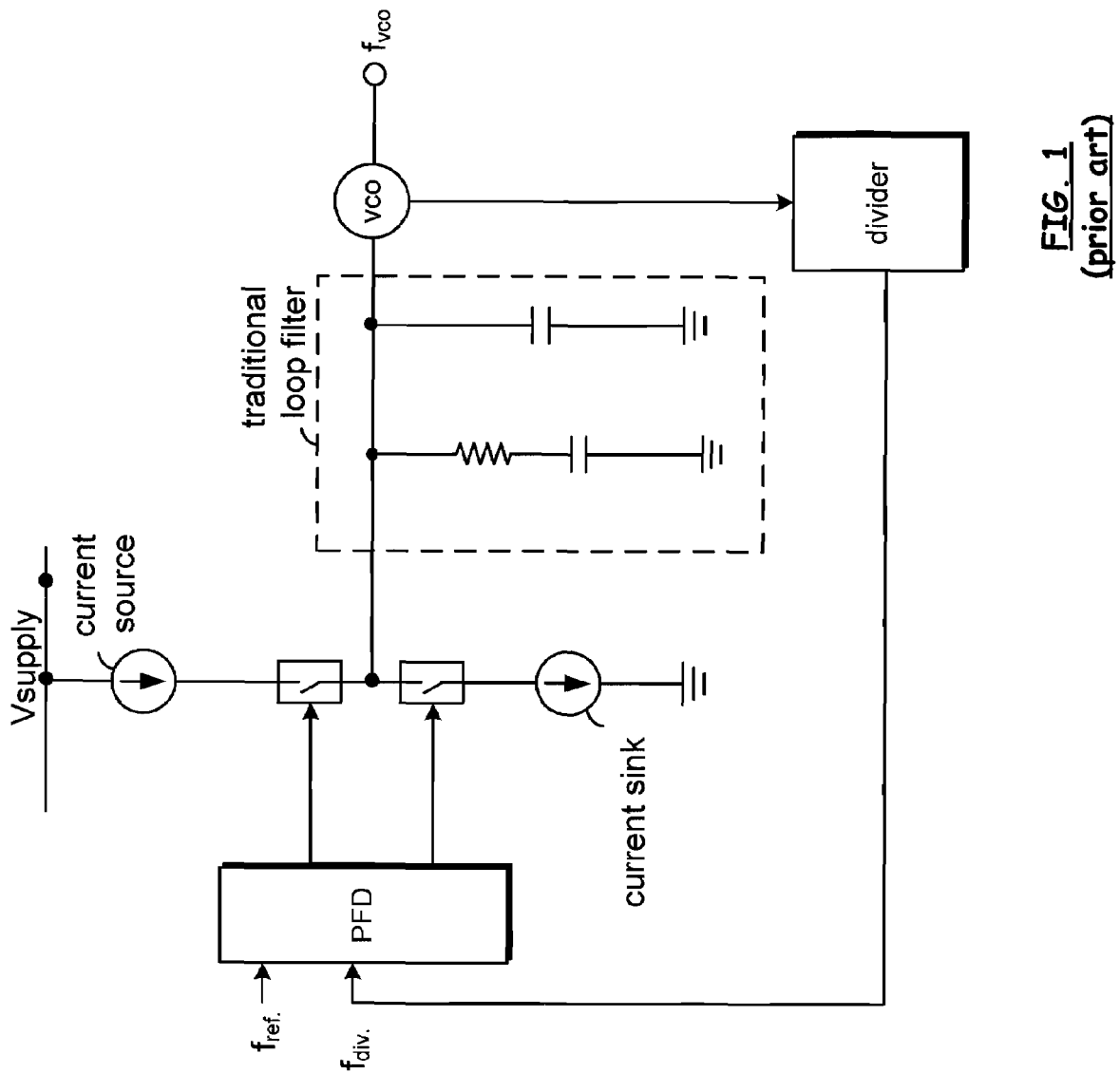
FIG. 1 is a functional schematic diagram of a prior art phase locked loop.
Figure 2:
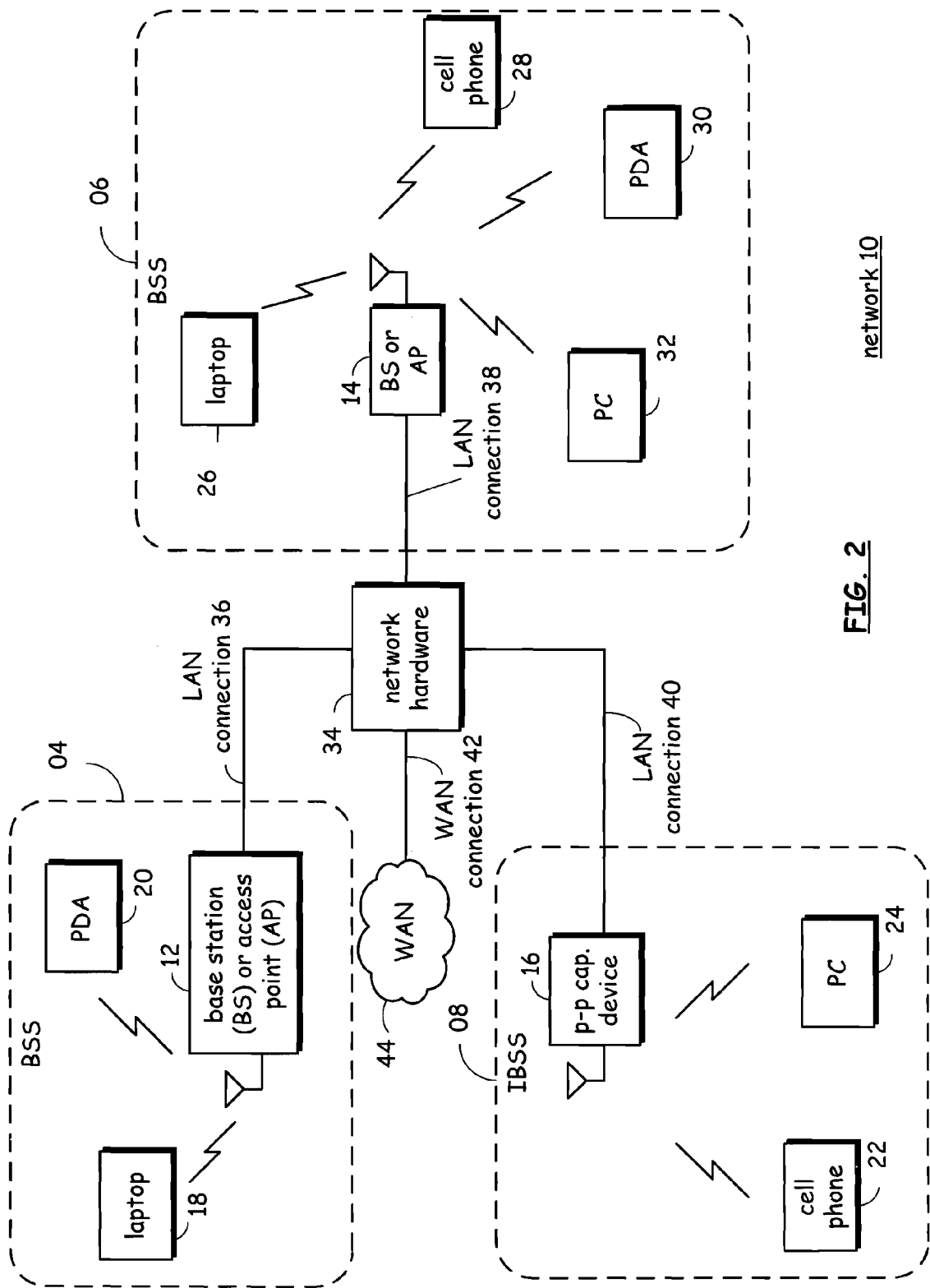
FIG. 2 is a functional block diagram illustrating a communication system that includes circuit devices and network elements and operation thereof according to one embodiment of the invention.

FIG. 2 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-14, a plurality of wireless communication devices 16-32 and a network hardware component 34. The wireless communication devices 16-32 may be laptop computers 18 and 26, personal digital assistants 20 and 30, personal computers 24 and 32 and/or cellular telephones 22 and 28. Wireless communication device 16 may also be a base station or access point 12-14. The details of the wireless communication devices will be described in greater detail with reference to FIGS. 2-10.

The base stations or APs 12-14 are operably coupled to the network hardware component 34 via local area network (LAN) connections 36, 38 and 40 as pare PC's 24. The network hardware component 34, which may be a router, switch, bridge, modem, system controller, etc., provides a wide area network (WAN) connection 42 for the communication system 10 to an external network element such as WAN 44. Each of the base stations or access points 12-14 has an associated antenna or antenna array to communicate with the wireless communication devices in its area. Typically, the wireless communication devices 16-32 register with the particular base station or access points 12-14 to receive services from the communication system 10. For direct connections (i.e., point-to-point or peer-to-peer communications), wireless communication devices such as wireless communication device 16 communicate directly via an allocated channel. Wireless communication device 16 may be an access point or any other device capable of engaging in IEEE 802.11 IBSS type communications in the described embodiment. In alternate embodiments, other point-to-point or peer-to-peer protocol communications may be implemented.

Typically, base stations are used for cellular telephone systems and like-type systems, while access points are used for in-home or in-building wireless networks. Regardless of the particular type of communication system, each wireless communication device includes a built-in radio and/or is coupled to a radio. Each of the integrated circuit radio transceivers within the radios comprise circuitry that are operable to provide a precise signal response wherein the circuitry is at least one of a filter, a voltage source or a current source. The approach and circuitry disclosed herein, however, may be used in conjunction with any application that includes resistive components that affect an output signal characteristic for which a precise response is required. In an IBSS service area 08, wireless communication devices 16 are operable to communicate with each other and other wireless communication devices 16-32 using IBSS peer-to-peer ad-hoc communication protocols.

Figure 3A:
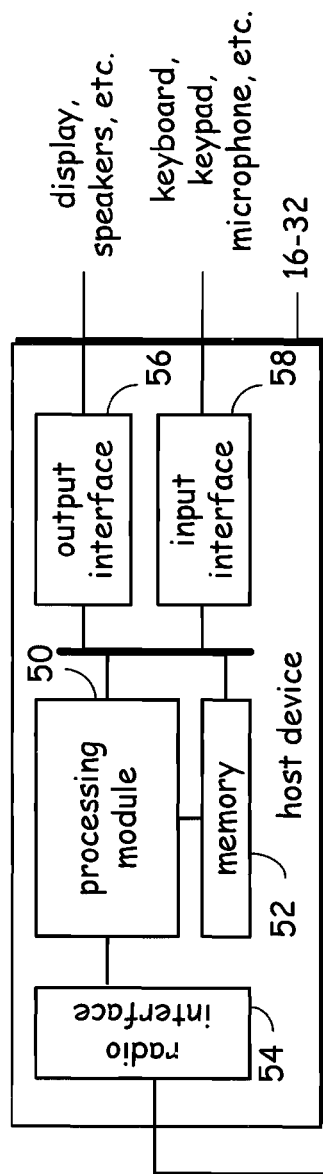
FIGS. 3A and 3B are schematic block diagrams illustrating embodiments of a wireless communication host device and an associated radio that include a frequency synthesizer with a switch capacitor loop filter.
Figure 3A:
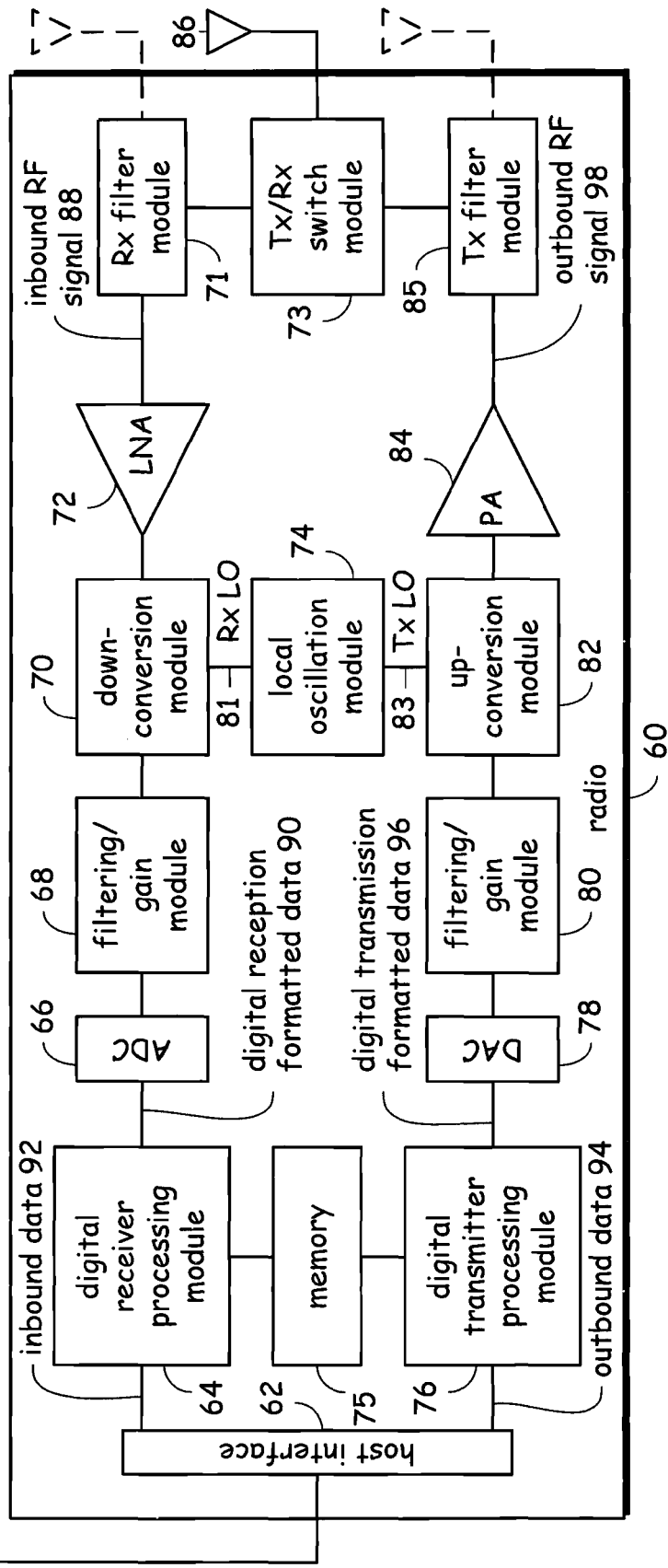

FIG. 3A is a schematic block diagram illustrating a wireless communication host device 16-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 16-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant. Oscillation module 74 is formed to include at least one embodiment or aspect of the present embodiments of the invention.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 16-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 16-32 via radio interface 54.

As one of average skill in the art will appreciate, the wireless communication device of FIG. 3A may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3B:
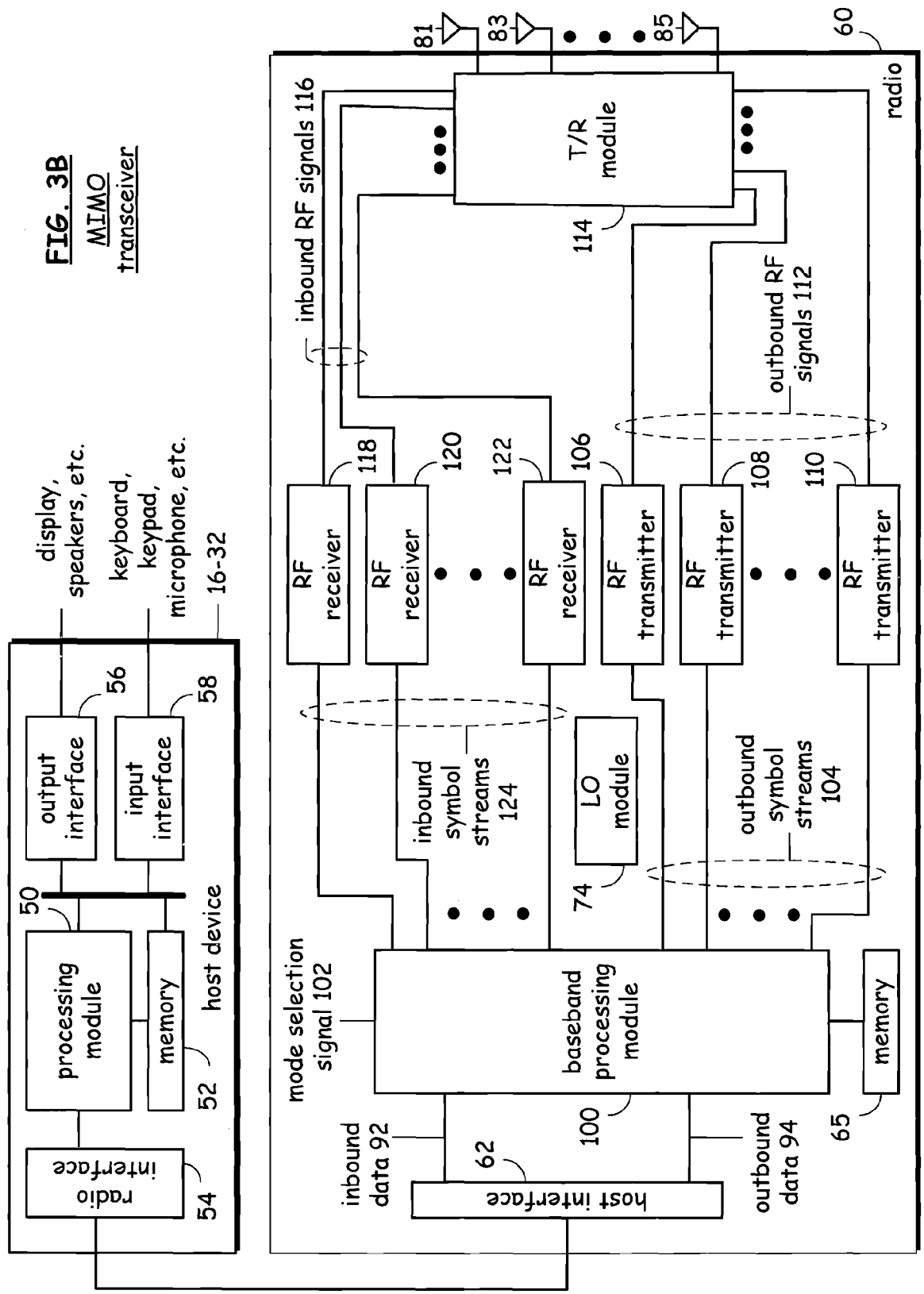

FIG. 3B is a schematic block diagram illustrating a wireless communication device that includes the host device 16-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 16-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 16-32 via the host interface 62.

As one of average skill in the art will appreciate, the wireless communication device of FIG. 3B may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
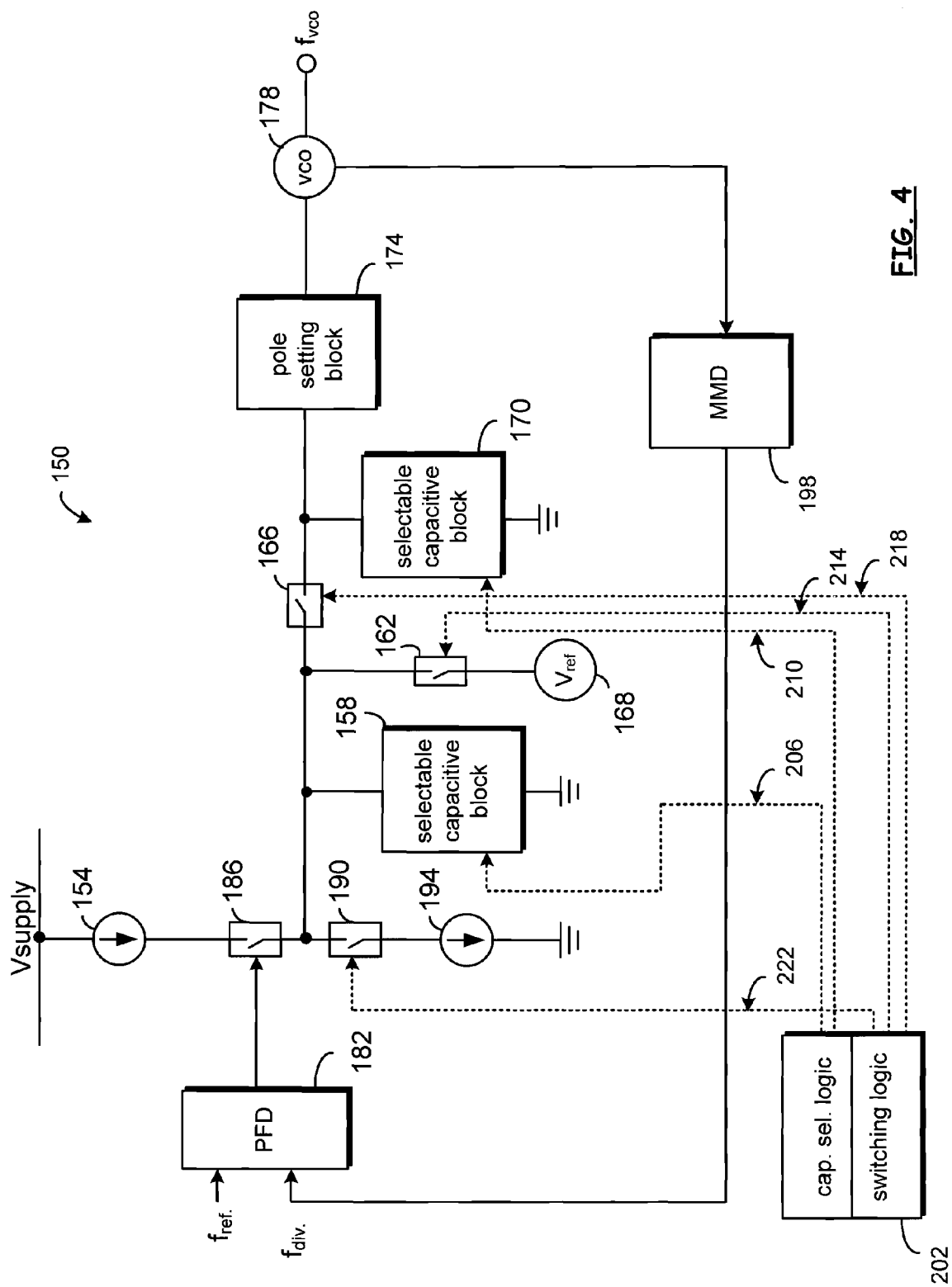
FIG. 4 is a functional block diagram of a frequency synthesizer that includes a capacitive loop filter according to one embodiment of the present invention.

FIG. 4 is a functional block diagram of a frequency synthesizer that includes a capacitive loop filter according to one embodiment of the present invention. A frequency synthesizer or phase locked loop 150 includes a supply voltage that is operably coupled to a first current source 154. First current source 154 is coupled to source a current into an input node of a capacitive loop filter that includes a selectable capacitive block 158, a shorting switch 162 that is operably disposed in parallel to selectable capacitive block 158, a decoupling switch 166 and a selectable capacitive block 170 that is operably coupled in parallel to selectable capacitive block 158. Decoupling switch 166 is disposed in between input nodes of selectable capacitive blocks 158 and 170 and, more specifically, between input nodes of selectable capacitive blocks 158 and 170. Further, in the described embodiment, a pole setting block 174 is operably disposed between the input node for selectable capacitive block 170 and a VCO 178.

As may further be seen, a PFD 182 is operably disposed to provide control commands to a switch 186 that is coupled between current source 154 and the input node to the capacitive loop filter and, more particularly, to selectable capacitive block 158. In the embodiment shown, a switch 190 is coupled downstream of the input node to the capacitive loop filter, and more particularly, to the selectable capacitive block 158. Downstream of switch 190 is a current source 194 operating in the described embodiment as a current sink.

As may further be seen, a Multi-modulos divider (MMD) 198 is coupled in a feedback loop between VCO 178 and an input to PFD 182. The PFD 182 is operable to generate control signals to switch 186 based upon a difference in a frequency between a reference signal and the output signal produced by MMD 198.

Finally, the embodiment of FIG. 4 includes a logic block 202 that includes capacitance selection logic and switching logic. As may be seen, logic block 202 generates control signals to selective capacitance blocks 158 and 170 over control lines 206 and 210, respectively, to selectively control what selectable capacitive elements are operably disposed, within the embodiment of FIG. 4, to provide charge storage to generate the VCO input signal to VCO 178 by way of pole setting block 174.

Logic block 202 also includes switching logic that is operable to generate control signals over lines 214 and 218 to control the opening and closing of switches 162 and 166, respectively. By closing switch 162, selectable capacitive block 158 is shorted to circuit common to discharge any stored charge. By closing switch 166, selectable capacitive blocks 158 and 170 are operatively coupled to share charge and to jointly generate the input signal to VCO 178. The switching logic of logic block 202 also generates, in the described embodiment, control signals over an optional control line 222 to open and close switch 190 if sinking current from the input node to the capacitive loop filter is desired. In an alternate embodiment, PFD 182 generates control signals to switch 190 whenever current sinking from the input node of the capacitive loop filter is desired.

More specifically, logic 202 generates a current sink control signal over line 206 to selectable open or close switch 190 in one embodiment of the invention to adjust a charge rate of the capacitive elements of selectable capacitive blocks 158 and 170 or, alternatively, to reduce a charge of one or both of selectable capacitive blocks 158 and 170. In contrast to a traditional prior art charge pump, therefore, current source (operating as a sink) 194 may be sued to reduce a VCO output frequency or to adjust a charge rate of a loop filter. Further, the operational coupling of current source 194 is by logic 202 which is separate from the PFD 182 that traditionally controls the operation of a current source coupled as a sink of a charge pump.

Figure 5:
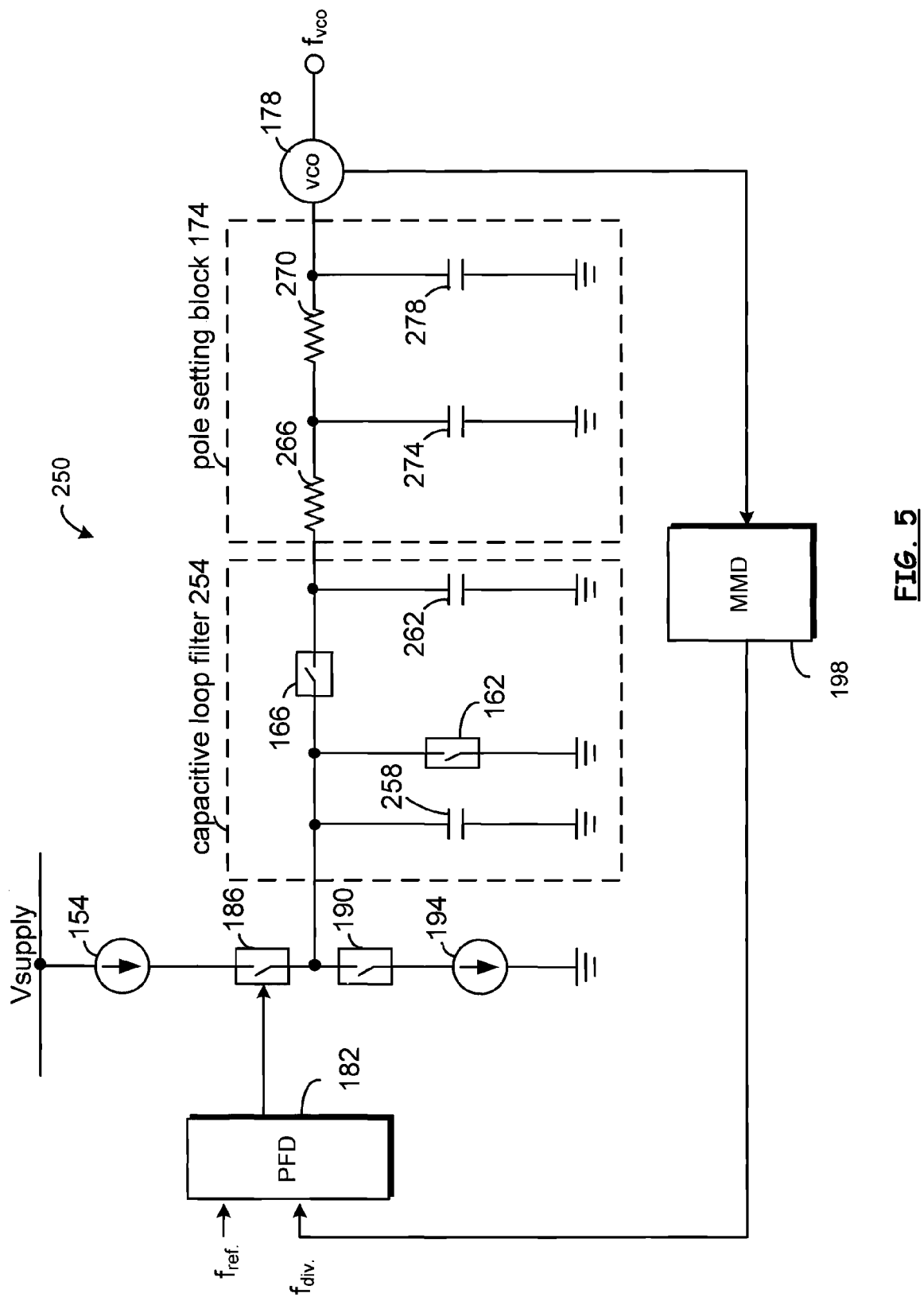
FIG. 5 is a functional schematic diagram of a capacitive loop filter according to one embodiment of the present invention.

As may also be seen, logic 202 generates capacitive control commands to selectable capacitive blocks 158 and 170 over control lines 210 and 214, respectively, to select capacitive levels. Logic 202 also generates switch control commands to switch 162 over line 218 to selectively short selectable capacitive element 158 to ground, to circuit common, or as shown, to a reference voltage source 168. Logic 202 also generates switch control commands to switch 166 over line 222 to selectively decouple selectable capacitive blocks 158 and 170. Reference voltage source 168 may be circuit common or ground or may be a voltage source having a specified voltage magnitude. Using a voltage source with a specified voltage magnitude is operable to provide control for an amount of discharge and therefore minimize an amount of subsequent recharging that is required to occur after discharge by the closing of switch 162. FIG. 5 is a functional schematic diagram of a capacitive loop filter according to one embodiment of the present invention. Referring to FIG. 5, a capacitive loop filter 254 is operably disposed within a phase locked loop 250 serially between charge pump circuitry and pole setting block 174 which, in turn, is upstream of VCO 178. Capacitive loop filter 254 includes a capacitive element 258 that is operably disposed and parallel with selectable switch 162 which is referenced herein as shorting switch 162. Both capacitive element 258 and shorting switch 162 are operably disposed upstream of decoupling switch 166. While switch 162 is shown as being coupled to ground, it should be understood that switch 162 may also be coupled to a voltage source as in the embodiment of FIG. 4 wherein switch 162 is coupled to Vref 168. Whether switch 162 is coupled to ground (circuit common) or to a reference voltage depends upon dynamic range requirements.

A capacitive element 262 is operably coupled between an output of decoupling switch 166 and circuit common. It should be understood that capacitive elements 258 and 262 may be single devices or may be replaced by selectable capacitive blocks, such as selectable capacitive blocks 158 and 170 of FIG. 4. Here they are shown as single capacitive elements 258 and 262 for simplicity.

As may further be seen, pole setting block 174 comprises a pair of series coupled resistors 266 and 270 and a pair of substantially parallel coupled capacitors 274 and 278 configured as shown within FIG. 5. Generally, pole setting block 174 is included to define operational poles at frequencies substantially removed from a frequency band defined by capacitive loop filter 254. Generally, each numbered component of FIG. 5 that was previously discussed in relation to FIG. 4 is numbered the same here and operates as described in relation to FIG. 4. As such, the operation of these two devices will not be discussed here.

In operation, according to one embodiment of the present invention, current source 154 selectively sources current into an input node of capacitive loop filter 254 based upon control commands received by switch 186 that are generated by PFD

182. As current is sourced into the input node of capacitive loop filter 254, the current is operable to charge any capacitive element not shorted to ground and not removed from connectivity by the opening of a switch.

As discussed in relation to FIG. 4, a logic block, not shown here in FIG. 5, is operable to selectively open and close shorting switch 162 and decoupling switch 166 according to modes of operation. Thus, when PFD 182 closes switch 186, and shorting switch 162 is open while decoupling switch 166 is also open, current source 154 will charge capacitive element 258. Thereafter, when switch 186 is opened by PFD 182, and decoupling switch 166 is closed, capacitive elements 258 and 262 will share the charge that each holds until each holds an equal amount of shared charge.

The shared charge is then produced to VCO 178 by way of pole setting block 174 to prompt VCO 178 to generate an output frequency. In one embodiment of the present invention, capacitive element 258 is periodically reset by shorting switch 162 and then subsequently recharged. The charge level of capacitive element 258 therefore affects the amount of shared charge between capacitive elements 258 and 262. Thus, if a desired effect is to lower the output frequency of VCO 178, capacitive element 258 is charged to a level that is lower than the charge of capacitive element 262 so that the shared charge will be lower than it was on the previous charge sharing to therefore lower the input signal to VCO 178 and the output frequency based upon that VCO input signal level.

Similarly, if the desired goal is to increase the output frequency of VCO 178, then the charge of capacitive element 258 is increased, while decoupling switch 166 is open, to a level higher than the charge level that resulted from the last charge sharing and that is higher than the present charge on capacitive element 262. Thereafter, when decoupling switch 166 is closed to facilitate the charge sharing between capacitive elements 258 and 262, the shared charge level is increased and therefore the VCO input signal level is increased to increase the output frequency of VCO 178.

In one embodiment of the present invention, capacitive element 258 is merely reset by shorting switch 162 and then recharged as desired. In an alternate embodiment, switch 190 is closed, either by PFD 182 or by switching logic such as the switching logic within logic block 202 of FIG. 4, to sink current from the input node of capacitive loop filter 254. To be clear, the input node to capacitive loop filter 254 is the node shown between switches 186 and 190.

In yet another embodiment, the combination of resetting capacitive element 258 by shorting switch 162 and sinking current from the input node of the capacitive loop filter is used according to specified modes of operation. For example, minor adjustments to a desired VCO input signal may be affected solely by sinking current away from capacitive element 258, while larger changes may be performed in the manner described before wherein the charge of capacitive element 258 is reset by shorting the capacitive element 258 to circuit common.

Figure 6:
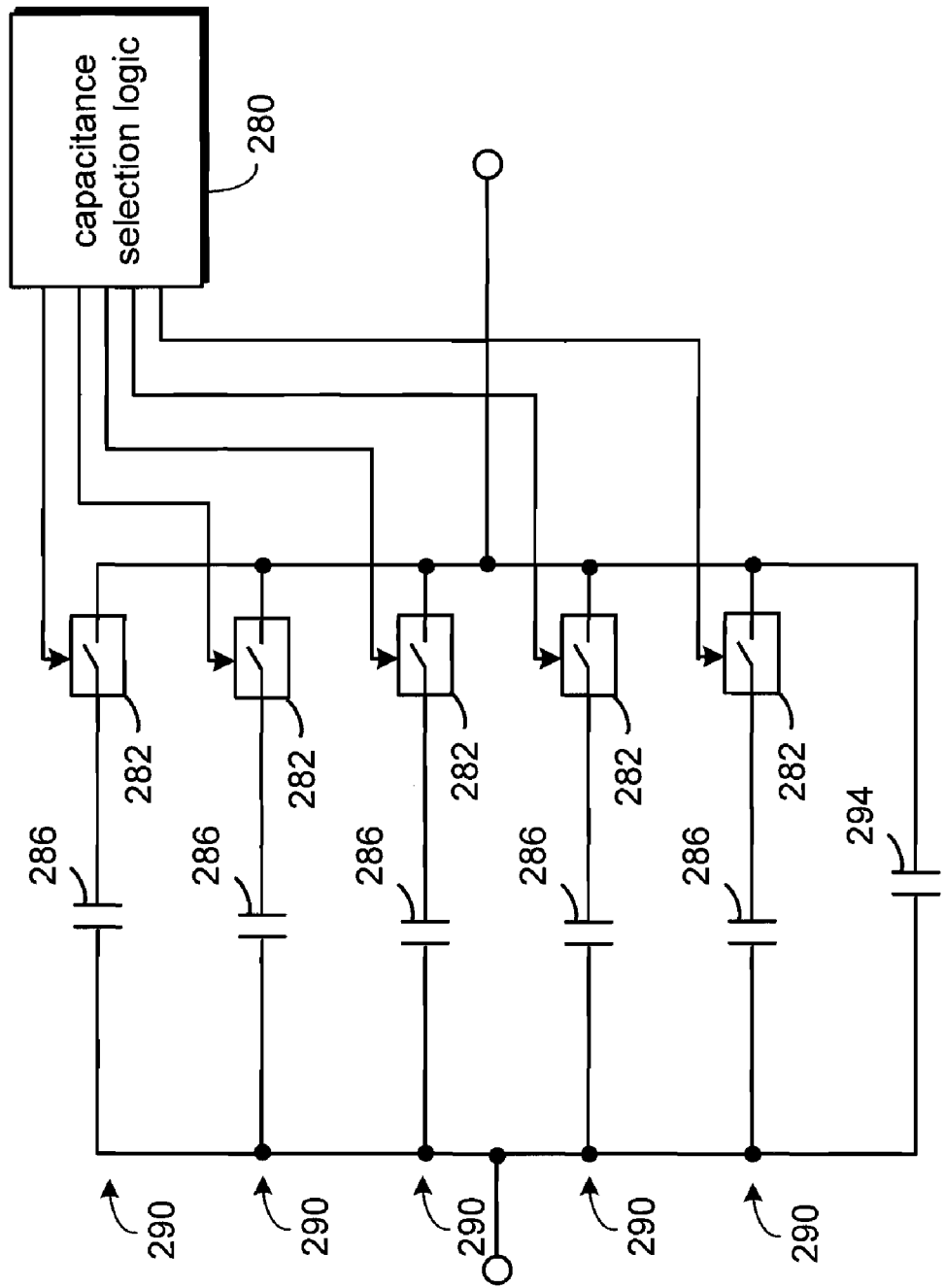
FIG. 6 is a functional schematic diagram of a selectable capacitive block according to one embodiment of the present invention.

FIG. 6 is a functional schematic diagram of a selectable capacitive block according to one embodiment of the present invention. Referring now to FIG. 6, capacitance selection logic 280 is operably disposed to provide control signals to each of a plurality of switches 282 that are each coupled in series with capacitive elements 286. As may be seen, each combination of a switch 282 and a capacitive element 286 forms a selectable capacitive branch 290. Each of the selectable capacitive branches 290 are coupled in parallel to each other and in parallel with a base capacitive element 294.

In operation, if capacitance selection logic 280 generates no control signals to close a switch connection for any of the switches 282, then the total capacitance provided by parallel capacitive block 194 is provided solely by capacitive element 294. For each control signal generated by capacitance selection logic 280 to close a switch connection of a corresponding switch 282, a capacitive branch 290 is operably disposed and parallel to capacitive element 294 to result in the capacitance being increased by the sum of the corresponding capacitive element 286 and base capacitive element 294.

Capacitance selection logic 280 may be formed within state logic, or may be defined by computer instructions that are executed by a baseband processor. For exemplary purposes, capacitance selection logic 280 may be part of the capacitance selection logic 202 shown in FIG. 4. The integrated circuit radio transceiver formed to include a parallel capacitive block, such as this shown in FIG. 6, for at least one of the first and second selectable capacitive blocks of FIGS. 4 and 5, use of substantially smaller capacitors in relation to traditional loop filter capacitors to provide improved predictability and consistency.

Figure 7:
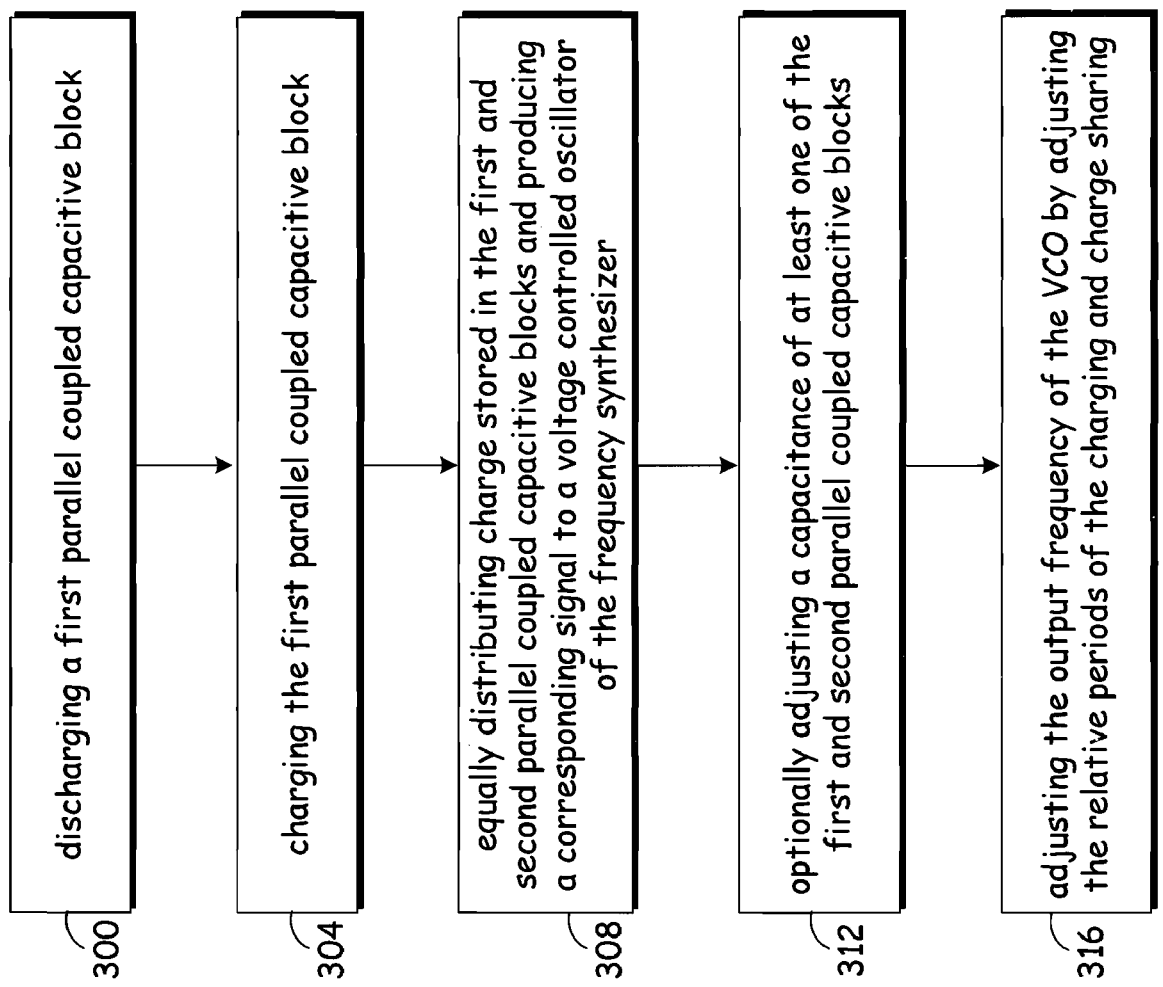
FIG. 7 is a flow chart illustrating a method for generating a voltage controlled oscillator input signal according to one embodiment of the present invention.

FIG. 7 is a flow chart illustrating a method for generating a voltage controlled oscillator input signal according to one embodiment of the present invention. The method initially includes discharging a first parallel coupled capacitive block (step 300). This discharging step includes, in one embodiment of the invention, generating a control command to a switch coupled in parallel to the first parallel coupled capacitive block to short the first parallel coupled capacitive block to circuit common. Thereafter, the method includes charging the first parallel coupled capacitive block (step 304). Obviously, this step includes opening the shorting switch that previously shorted the first parallel coupled capacitive block to enable the first parallel coupled capacitive block to charge.

In an embodiment of the invention that has structure similar to that disclosed herein which includes a decoupling switch to decouple the first parallel coupled capacitive block and a second parallel coupled capacitive block, one embodiment of the invention contemplates charging the first parallel capacitive block while decoupled from the second parallel coupled capacitive block. After the charging step 304, the embodiment of the invention includes equally distributing charge stored in the first and second parallel coupled capacitive blocks and producing a corresponding signal based upon these shared charge levels, to a voltage controlled oscillator of a frequency synthesizer (step 308).

The method further optionally includes adjusting a capacitance of at least one of the first and second parallel coupled capacitive blocks (step 312). In the described embodiment of the invention, logic generates control commands to selectively couple and decouple capacitive elements from connectivity with existing capacitance of at least one of the first and second parallel coupled capacitive blocks. Finally, the embodiment of the invention includes adjusting the output frequency of the VCO by adjusting the relative periods of the charging and charge sharing (step 316). For example, one embodiment contemplates adjusting a charge level of at least one of the first and second parallel coupled capacitive blocks to change the amount of charge and therefore input signal level to the VCO. Step 316, however, contemplates reducing or increasing an amount of time that a capacitive element may charge to effect the input signal level to the VCO.

Generally, by adjusting the amount of time that the first capacitive block is allowed to charge or the amount of time that the first and second capacitive blocks are allowed to share charge, the signal level generated by at least the second parallel coupled capacitive block to a VCO, for example, in the structure of FIG. 4 or FIG. 5, will effect the signal frequency produced by the VCO. This embodiment of adjusting the output frequency of the VCO by adjusting the relative periods of the charging and charge sharing, however, is an optional embodiment.

The preferred embodiment for adjusting the VCO output frequency by adjusting the VCO input signal is based primarily upon the charge level of the first parallel coupled capacitive block. Thus, to decrease a VCO output frequency, the charge of the first parallel coupled capacitive block is lowered to an amount that is less than a charge level of the second parallel coupled capacitive block so that, when the two parallel coupled capacitive blocks share a charge, the charge of the second parallel coupled capacitive block is reduced. Likewise, if the frequency of the VCO requires increasing, then the first parallel coupled capacitive block is charged to a level that exceeds the charge level of the second parallel coupled capacitive block.

Figure 8:
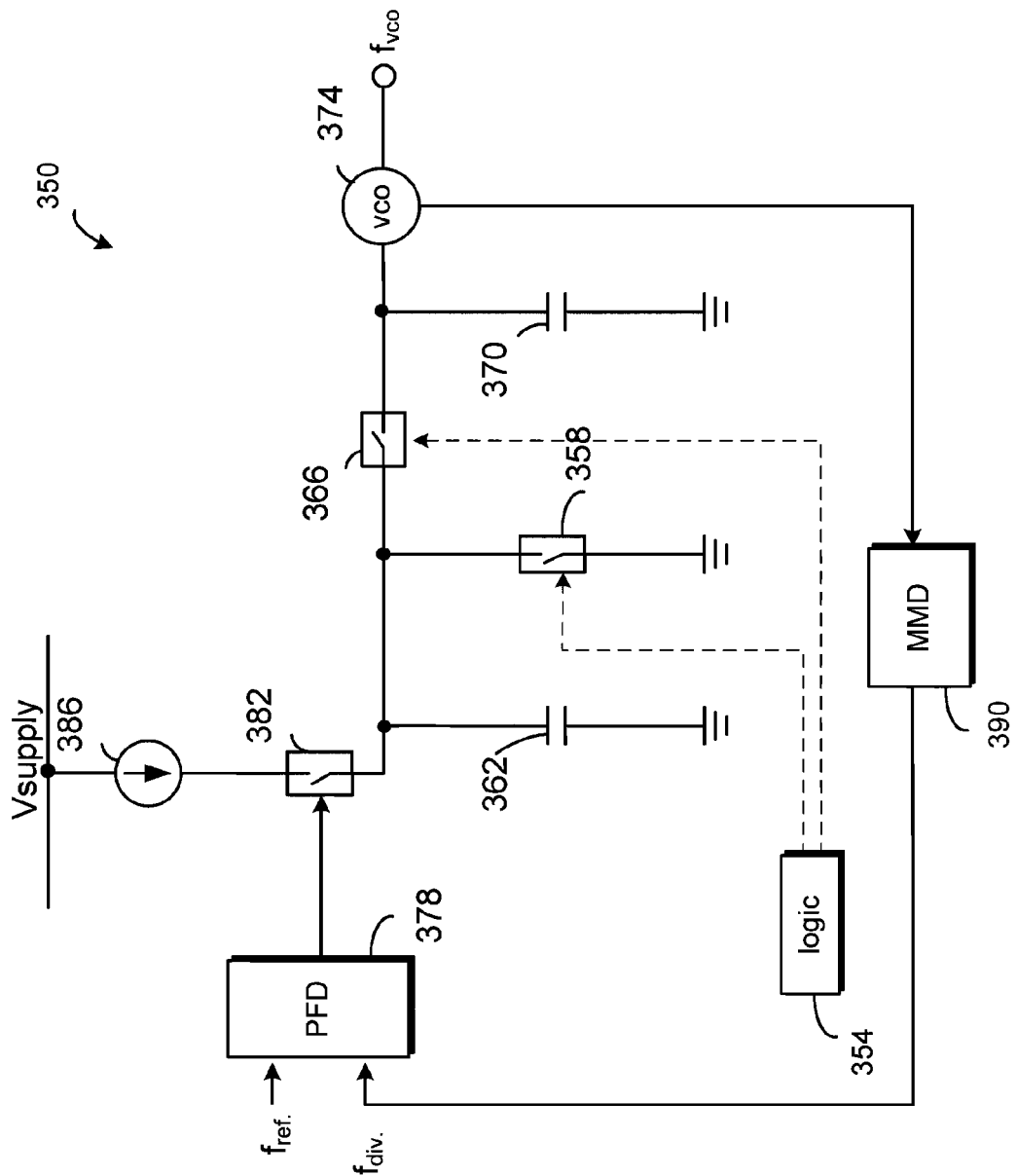
FIG. 8 is a functional schematic diagram of a capacitive loop filter within a phase locked loop according to one embodiment of the present invention.

FIG. 8 is a functional schematic diagram of a capacitive loop filter within a phase locked loop according to one embodiment of the present invention. A phase locked loop 350 includes logic 354 that is operably disposed to provide control signals to a shorting switch 358 and a decoupling switch 366 to control the opening and closing of switches 358 and 366. Switch 358 is operable to reset a first parallel capacitive element 362 by creating a short to discharge any charge on capacitive element 362 to circuit common, while decoupling switch 366 is operable to decouple first capacitive element 362 from a second capacitive element 370.

While switch 358 is shown as being coupled to ground, it should be understood that switch 358 may also be coupled to a voltage source as in the embodiment of FIG. 4 wherein switch 162 is coupled to Vref 168. Whether switch 358 is coupled to ground (circuit common) or to a reference voltage depends upon dynamic range requirements.

A charge level on capacitive element 370 (and when switch 366 is closed, capacitive element 362) is produced to a voltage controlled oscillator 374 which generates an oscillation based on an input signal level. As may further be seen, a phase frequency detector 378 is operable to generate control commands to a switch 382 that is operable to open and close a connection between a current source 386 and an input to the capacitive loop filter of phase locked loop 350. Specifically, when PFD 378 generates a close command to switch 382, current from current source 386 is operable to charge capacitive element 362 so long as shorting switch 358 is in an open position.

In the described embodiment of the invention, decoupling switch 366 is typically left in an open state, while capacitive element 362 is receiving current from current source 386 to generate a charge. As with prior embodiments, the output of VCO 374 is produced in a feedback loop back to PFD 378 in a divided form for comparison to a reference signal. The PFD 378 receives a divided oscillation which is generated by Multi-modulos divider 390 which may divide the oscillation either in an integer amount or by a fractional amount.

One interesting observation about the embodiment of FIG. 8 is that only one current source and one switch for coupling and decoupling the current source to the capacitive loop filter is provided. Because the charge on first capacitive element 362 is periodically discharged to ground by way of shorting switch 358, it is only necessary for the capacitive loop filter to be charged by current source 386.

This has numerous advantages in that less power is consumed, matching between a current source and a sinking current source is not required, and the single current source may be scaled to a much smaller size as it is not required to be scaled relatively large as with traditional phase locked loops for noise purposes. Operation of the charging and discharging of phase locked loop 350 will be described in greater detail in relation to the figures that follow. In general, however, the charge on first capacitive element 362 goes through a plurality of phases. One phase is a charging phase. A second phase is a charge sharing phase. A third stage is a discharge phase. With respect to the charge pump, which here comprises only one current source, current is merely sourced into the capacitive loop filter and is not drawn out therefrom to reduce charge on capacitive elements of the loop filter.

Figure 9:
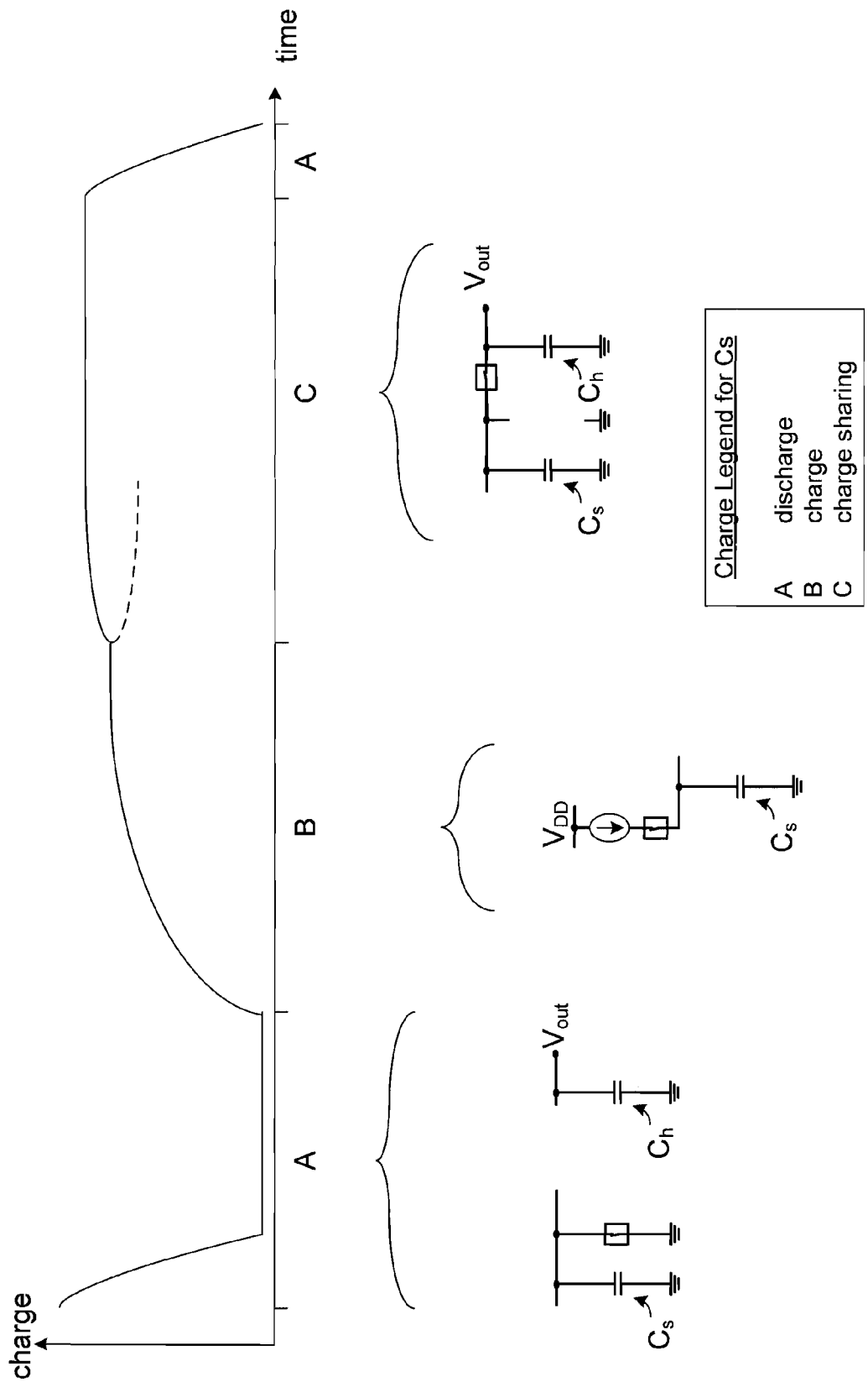
FIG. 9 is an illustration of the plurality of charging stages of a first capacitive element and the associated hardware configurations based on switching states of the shorting switch and the decoupling switch.

FIG. 9 is an illustration of the plurality of charging stages of a first capacitive element and the associated hardware configurations based on switching states of the shorting switch and the decoupling switch. As may be seen, in a first stage, labeled as A, the first capacitive element is in discharge state. As may be seen, charge on the capacitive device discharges to a 0 state and then stays flat for the remainder of the discharge stage. A second stage, labeled as B, is a charging stage wherein a charge on the capacitive device may be seen to increase in a somewhat logarithmic manner. In a third stage, a charge sharing stage, it may seen that the charge on the capacitive device continues to increase during the third charge sharing stage.

Such a response would result from the capacitive device being charged to a charge level that is less than that of the second parallel capacitive device. As such, when the decoupling switch is closed to couple the first and second parallel coupled capacitive devices, charge flows from the second device to the first device, thus increasing the charge on the first device as shown. As may also be seen, a dashed line is shown decreasing from the charge level of stage B to represent the capacitive device losing charge during the charge sharing stage. Finally, a stage A is shown again in which the first parallel capacitive device is discharged.

Each of these three stages has an associated circuit topology that results from the various switching states of the shorting and decoupling switches. With respect to stage A, the first parallel capacitive device is shown to be coupled with a shorting switch which is closed. As such, the charge on first capacitive device is discharged to circuit common, as is seen from the exemplary circuitry. As may further be seen, there is no coupling between the first parallel capacitive device and the second parallel capacitive device. In the charging stage, shown as stage B, the decoupling switch continues to remain open but the shorting switch is also opened.

As such, when the charge pump switch is closed, a current source is coupled to the first parallel capacitive device to provide a current thereto to enable a charge to develop across the first capacitive device. The second capacitive device is not shown because here, as before, it is not coupled to the first capacitive device. In a stage C, namely the charge sharing stage, the current source is decoupled by the opening of the switch from the charge pump, the shorting capacitor is left open, and the decoupling capacitor is closed. As such, the first and second capacitive devices are coupled in parallel and are operable to share charge.

As the second capacitive device is continuously connected to the input of the VCO in the described embodiment of the invention, the combination of the first and second parallel coupled capacitive devices generates the input signal to the VCO even while the first and second capacitive devices are sharing charge to equalize the charge levels on each parallel coupled capacitive device. A legend to the graph of FIG. 9 shows that stage A is a discharge stage, stage B is a charging stage, and stage C is a charge sharing stage. Each of the circuit configurations that correspond to these charge stages is shown in associated therewith.

FIG. 10 is a flow chart illustrating a method according to one embodiment of the present invention. Initially the method includes generating loop filter switching commands to the capacitive loop filter to configure the loop filter into one of a plurality of desired charging states (step 400). In a first charge state, the method includes supplying all required current to the capacitive loop filter from a single current source (step 404). This includes not using a second current source to sink current from the capacitive loop filter. Thereafter, the method includes generating switching commands to configure the capacitive loop filter to operate in a discharge mode (step 408).

Thereafter, the method includes generating switching commands to configure the capacitive loop filter to operate in a charge mode (step 412) and subsequently generating switching commands to configure the capacitive loop filter to operate in a charge sharing mode (step 416). Finally, the method includes generating the VCO input signal level while in discharge mode, in the charge mode, and in the charge sharing mode (step 420). In the discharge mode and in the charge mode, according to one embodiment of the invention, the VCO input signal level is generated solely from a second parallel coupled capacitive device.

In the charge sharing mode, however, the VCO input signal level is generated from the parallel combination of first and second parallel coupled capacitive devices. In general, the method steps of FIG. 10 illustrate a three-state capacitive loop filter that operates in a discharge mode, a charge mode, and a charge sharing mode. Each mode has a unique associated circuit topology which configuration is driven by the opening and closing of a plurality of switching devices. A first switching device is a traditional charge pump switch that couples and decouples a current source from the loop filter.

One unique aspect of the embodiments of the present invention, however, is that only one current source is used to source current into the capacitive loop filter while no current sources are used to drain or sink current from the capacitive loop filter. As such, the disclosed embodiments include only one current source and one charge pump switch. Additionally, a shorting switch and a decoupling switch are used to establish the different configurations according to the charge mode of operation.

Thus, one switch is used to reset a first parallel coupled capacitive device to enable it to be charged to the desired level, while a second switch, a decoupling switch, is used to selectively couple and decouple the first and second parallel coupled capacitive devices. In the described embodiments, the VCO signal input level is adjusted by charging the first parallel coupled capacitive device to a level that is either higher or lower than the second parallel coupled capacitive device according to whether there is a desired increase or decrease in the output oscillation frequency of the voltage controlled oscillator.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit radio transceiver, comprising:
   a baseband processor for generating outgoing digital signals and for receiving and processing ingoing digital signals;
   front-end circuitry for producing outgoing RF based upon the outgoing digital signals and for producing the ingoing digital signals based upon received ingoing RF; and
   a frequency synthesizer of the front-end circuitry that generates a local oscillation for front-end circuitry operations, comprising:
      a signal level stage comprising first and second capacitive blocks;
      a selectable first switch operable to create a shorting signal path, the selectable first switch operably disposed across the first capacitive block and circuit common;
      a selectable second switch operably disposed between an input node of the selectable first switch and an input of the second capacitive block;
      wherein at least one of the first and second capacitive blocks comprises a plurality of parallel coupled capacitors and further wherein at least one of the plurality of parallel coupled capacitors is selectable; and
      logic operable to regulate charge sharing between the first and second capacitive blocks to control a voltage controlled oscillator (VCO) input voltage by generating switch control signals to perform specified switching to open the selectable second switch while closing the selectable first switch to short the first parallel coupled capacitive block and to open the selectable first switch while closing the second selectable switch to allow the first and second parallel coupled capacitive blocks to share charge.

2. The integrated circuit of claim 1 wherein the logic performs the specified switching at a frequency that substantially exceeds an input signal frequency range of an input signal.

3. The integrated circuit radio transceiver of claim 1 wherein frequency synthesizer further includes a charge pump having at least one current source wherein the at least one current source is sized substantially lower than a value required to counteract noise generated within the first capacitive block.

4. The integrated circuit radio transceiver of claim 1 wherein the second capacitive block of the frequency synthesizer further includes an outside pole setting stage for defining impedance poles at a frequency substantially removed from a center frequency of the signal level stage.

5. The integrated circuit radio transceiver of claim 1 wherein the second capacitive block filters noise produced in the first capacitive block.

6. The integrated circuit radio transceiver of claim 1 further comprising logic to select the selectable parallel capacitors to adjust the VCO input signal level produced to the VCO and a corresponding frequency of oscillation produced by the VCO.

7. The integrated circuit radio transceiver of claim 1 wherein a bandwidth of the frequency synthesizer is based on a ratio of a capacitance of the second capacitive block (C(h)) divided by a capacitance of the first parallel coupled capacitive block (C(s)).

8. The integrated circuit radio transceiver of claim 7 wherein at least one of C(h) and C(s) is changed to maintain a constant output bandwidth in response to variations to a reference clock produced by a clock of the frequency synthesizer.

9. The integrated circuit radio transceiver of claim 1 wherein the logic is operable to adjust output frequencies of the VCO to maintain a constant output frequency based upon variations in reference frequencies by selectively coupling at least one parallel coupled selectable capacitor of at least one of the first and second capacitive blocks.

10. The integrated circuit radio transceiver of claim 1 wherein the logic is operable to adjust output frequencies of the VCO based upon variations in reference frequencies by adjusting the specified switching.

11. The integrated circuit radio transceiver of claim 1 wherein the logic is operable to adjust output frequencies of the VCO and to adjust an output signal bandwidth for a constant reference frequency by selectively coupling at least one parallel coupled selectable capacitor of at least one of the first and second capacitive blocks.

12. The integrated circuit radio transceiver of claim 1 wherein capacitors of the second capacitive block are substantially smaller in relation to capacitors of the first capacitive block.

13. The integrated circuit radio transceiver of claim 1 wherein the logic is operable to adjust at least one of the output frequencies of the VCO and an output signal bandwidth, all based upon a constant reference frequency, by selectively coupling at least one parallel coupled selectable capacitor of at least one capacitive block in an iterative manner.

14. A frequency synthesizer of front-end circuitry of a radio transceiver, comprising:
    a signal level stage comprising first and second capacitive blocks operably disposed in series;
    a selectable first switch operable to create a shorting signal path, the selectable first switch operable dispose across the first capacitive block and circuit common;
    a selectable second switch operably dispose between an input node of the selectable first switch and an input of the second capacitive block;
    wherein at least one of the first and second capacitive blocks comprises a plurality of parallel coupled capacitors and further wherein at least one of the plurality of parallel coupled capacitors is selectable; and
    logic operable to produce switch control signals to perform specified switching to open the second selectable switch while closing the selectable first switch to short the first parallel coupled capacitive block and to open the selectable first switch while closing the second selectable switch to allow the first and second capacitive blocks to share charge.

15. The frequency synthesizer of claim 14 wherein the frequency synthesizer further includes an outside pole setting stage for defining impedance poles at a frequency substantially removed from a center frequency of the signal level stage of the frequency synthesizer.

16. The frequency synthesizer of claim 14 wherein at least one of the first and second capacitive blocks comprises a plurality of parallel capacitors and further wherein at least one of the plurality of parallel capacitors is selectable.

17. The frequency synthesizer of claim 16 further comprising logic to select the selectable parallel capacitors to adjust the signal level produced to a VCO and a frequency of oscillation of the VCO.

18. The frequency of claim 14 wherein the logic is operable to adjust output frequencies of a VCO to maintain a constant output frequency responsive to variations in a reference frequency by selectively coupling at least one parallel coupled selectable capacitor of at least one of the capacitive blocks.

19. The frequency synthesizer of claim 14 wherein the logic is operable to adjust output frequencies of a VCO based upon variations in the reference frequency by adjusting the specified switching.

20. The frequency synthesizer of claim 14 wherein the logic is operable to adjust at least one of an output frequency of a VCO and to adjust an output signal bandwidth, all for a constant reference frequency, by selectively coupling at least one parallel coupled selectable capacitor of at least one of the first and second capacitive block.

21. The frequency synthesizer of claim 14 wherein capacitors of the second capacitive block are substantially smaller in relation to capacitors of the first capacitive blocks.

22. A method for adjusting a frequency of oscillation in a frequency synthesizer of front-end circuitry of an integrated circuit radio transceiver wherein the frequency synthesizer comprises first and second parallel-coupled capacitive blocks operably disposed to produce a signal to a voltage-controlled oscillator (VCO), the method comprising:
    opening a connection between the first and second parallel coupled capacitive blocks and discharging the first parallel coupled capacitive block;
    charging the first parallel coupled capacitive block;
    closing the connection between the first and second parallel coupled capacitive blocks;
    equally distributing charge stored in the first and second parallel coupled capacitive blocks and producing a corresponding signal to the voltage controlled oscillator of the frequency synthesizer; and
    adjusting a capacitance of at least one of the first and second parallel-coupled capacitive blocks to change a signal level of the corresponding signal produced to the voltage-controlled oscillator.

23. The method of claim 22 further including adjusting an output frequency of the VCO by adjusting the frequency of the charging and charge sharing of the first and second parallel coupled capacitive blocks.

24. The method of claim 22 further including adjusting an output frequency of the VCO by adjusting the relative periods of the charging and charge sharing of the first and second parallel coupled capacitive blocks.

25. The method of claim 22 further including adjusting at least one of an output frequency of the VCO and an output signal bandwidth by selectively coupling at least one parallel-coupled selectable capacitor of at least one parallel capacitive block.

* * * * *